United States Patent
Brown et al.

(10) Patent No.: US 6,918,864 B1
(45) Date of Patent: Jul. 19, 2005

(54) ROLLER THAT AVOIDS SUBSTRATE SLIPPAGE

(75) Inventors: Brian J. Brown, Palo Alto, CA (US); Michael Sugarman, San Francisco, CA (US); Makoto Inagawa, Palo Alto, CA (US); Daniel D. Ramar, Santa Cruz, CA (US); Alexander Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 573 days.

(21) Appl. No.: 09/580,880

(22) Filed: May 30, 2000

Related U.S. Application Data
(60) Provisional application No. 60/136,910, filed on Jun. 1, 1999.

(51) Int. Cl.[7] .................................. A01B 29/00
(52) U.S. Cl. .......................... 492/33; 492/31
(58) Field of Search ................. 492/30, 31, 33, 492/34, 36, 37, 28; 226/188, 189, 190, 193, 95, 97.4; 15/77; 242/332.3; 100/121; 29/895.3, 895.31

(56) References Cited

U.S. PATENT DOCUMENTS

| | | | | |
|---|---|---|---|---|
| 2,837,330 A | * | 6/1958 | Lawrance et al. | 226/95 |
| 3,122,295 A | * | 2/1964 | Davison et al. | 226/50 |
| 3,848,403 A | * | 11/1974 | Bobkowicz et al. | 57/5 |
| 3,930,603 A | * | 1/1976 | Grant | 226/188 |
| 3,987,612 A | * | 10/1976 | Bobkowicz | 57/5 |
| 4,065,044 A | * | 12/1977 | Painter et al. | 226/188 |
| 4,070,892 A | * | 1/1978 | Kholmogorov et al. | 492/1 |
| 4,269,055 A | * | 5/1981 | Sivachenko et al. | 492/1 |
| 4,989,305 A | * | 2/1991 | Pole et al. | 100/121 |
| 5,840,129 A | | 11/1998 | Saenz et al. | |
| 5,862,560 A | | 1/1999 | Jensen et al. | |

FOREIGN PATENT DOCUMENTS

DE        30 43 626 A1  *  9/1982

* cited by examiner

*Primary Examiner*—Marc Jimenez
(74) *Attorney, Agent, or Firm*—Dugan & Dugan (57) ABSTRACT

A roller assembly is provided. The roller assembly comprises a groove that the includes two opposing surfaces. The roller assembly comprises either frictional surfaces positioned along the groove, or O-ring(s) coupled to the groove. The frictional surfaces may be a plurality of holes at spaced intervals along the opposing surfaces of the groove, a plurality of holes, each hole sized so as to extend into the two opposing surfaces, at spaced intervals along the opposing surfaces of the groove, or may be a bead-blasted surface or a knurled surface positioned along the opposing surfaces of the groove.

13 Claims, 8 Drawing Sheets

ROLLER THAT AVOIDS SUBSTRATE SLIPPAGE

This application claims priority from U.S. provisional application Serial No. 60/136,910, filed Jun. 1, 1999.

FIELD OF THE INVENTION

The present invention relates to the rotation of thin disks. More specifically, the present invention relates to an improved roller for rotating semiconductor substrates within a tank of fluid.

BACKGROUND OF THE INVENTION

A conventional method for cleaning particles from semiconductor wafers submerged within a tank of fluid is known as megasonic cleaning. During megasonic cleaning, a transducer oscillates between compressed and strained states at a rate near 1 MHz. The megasonic oscillation output by the transducer is coupled to the fluid contained within the tank, causing pressure oscillation therein. As the pressure in the fluid oscillates between positive and negative, cavitations or bubbles form in the liquid during negative pressure and collapse or shrink during positive pressure. This bubble oscillation gently cleans the surface of the wafer.

In practice, megasonic cleaners experience a number of limitations. For instance, the intensity of the cleaning energy experience across the wafer's surface often decreases with increased distance from the transducer. This energy gradient necessitates wafer rotation in order to achieve uniform cleaning across the entire wafer surface.

Conventionally, to achieve rotation, a wafer is positioned on a pair of rollers each of which are mounted to a shaft that extends through the wall of the megasonic tank. Outside the megasonic tank each shaft is coupled to a motor that when energized causes the shaft, and the roller attached thereto to rotate. As the rollers rotate, so does the wafer positioned thereon.

Although the roller assemblies facilitate uniform wafer cleaning across the entire surface of the wafer, they also experience several drawbacks. For instance, a particular challenge has been maintaining smooth-continuous wafer rotation. In practice, a wafer may periodically slip along the groove, causing the wafer rotation to momentarily decelerate or cease. This change in rotation can cause uneven cleaning or processing across the wafer's surface, can generate particles which may potentially contaminate the wafer or may interfere with processing, or can result in miss-orientation of the wafer at the completion of rotation (e.g., in systems which rely on consistent wafer rotation to place the wafer in a desired orientation after a given processing time).

Accordingly, a need exists for a roller that maintains sufficient contact with a substrate to avoid relative movement or slippage therebetween. Such a roller preferably should be easy to manufacture so as not to add cost and complexity to the system.

SUMMARY OF THE INVENTION

The present invention provides a roller that comprises a frictional surface within the wafer-contacting groove. The frictional surface may prevent wafer slippage and, in its preferred embodiment, does so without increasing the area of contact between the wafer and roller. In certain aspects the invention minimizes wafer contact because the wafer is contacted by frictional points within the groove rather than by a smooth surface. Additionally, the friction points reduce the probability that fluid may be trapped between the wafer and the roller, as trapped fluid may act as a lubricant or cause hydroplaning between the wafer and roller.

In a first aspect of the invention, the roller surface which contacts the wafer (i.e., the bottom and/or lower side walls of the groove) comprises a plurality of holes which are drilled or formed therein. Preferably, the wafer contacts the roller via two opposing surfaces (e.g., certain "v" or "u" shaped grooves) in which case the holes may be drilled at spaced intervals along these opposing surfaces, or may be drilled along the roller's interior diameter, and may be sized so as to extend into the two opposing surfaces which contact the wafer's edge. This embodiment may be inexpensive to manufacture, and may allow fluid to move from the frictional point of contact (e.g., the edge of the hole), into the center of the hole. In this manner surface contact may be minimized yet frictional contact may be maximized.

Further aspects of the invention comprise bead blasting or knurling the wafer contacting surfaces. Yet another aspect of the invention comprises placing one or more O-rings along the roller's wafer contacting surface. The O-rings may be comprised of a material (e.g., PEEK, etc.) which is either sufficiently frictional or sufficiently elastic so as to grip the wafer, yet able to wear well without resulting in particle generation, and without readily deteriorating when exposed to processing conditions (heat, chemistry, etc.), as will be apparent to a worker of ordinary skill in the art of materials. One aspect of the invention places two O-rings along the roller's interior diameter (the surface that contacts the wafer's outer edge). The O-rings are positioned such that the wafer's edge may be inserted therebetween.

Other features and advantages of the present invention will become more fully apparent from the following detailed description of the preferred embodiments, the appended claims and the accompanying drawings.

DETAILED DESCRIPTION OF THE PREFERRED EMBODIMENTS

An inventive roller assembly is provided. The inventive roller assembly comprises a groove having, for example, a V-shape (as shown), a U-shape (not shown), or any other similar shape. The groove includes two opposing surfaces adapted to support a wafer by its edge as is known in the art. The inventive roller assembly further comprises either frictional surfaces located along the opposing surfaces of the groove and/or located along the bottom of the groove or an O-ring(s) located along the bottom of the groove. The frictional surfaces may be either a plurality of holes at spaced intervals along the opposing surfaces of the groove, each hole may be sized so as to extend into both of the two opposing surfaces, or may be a bead-blasted or knurled surface positioned along the wafer contacting surfaces of the groove.

Figure 1A:
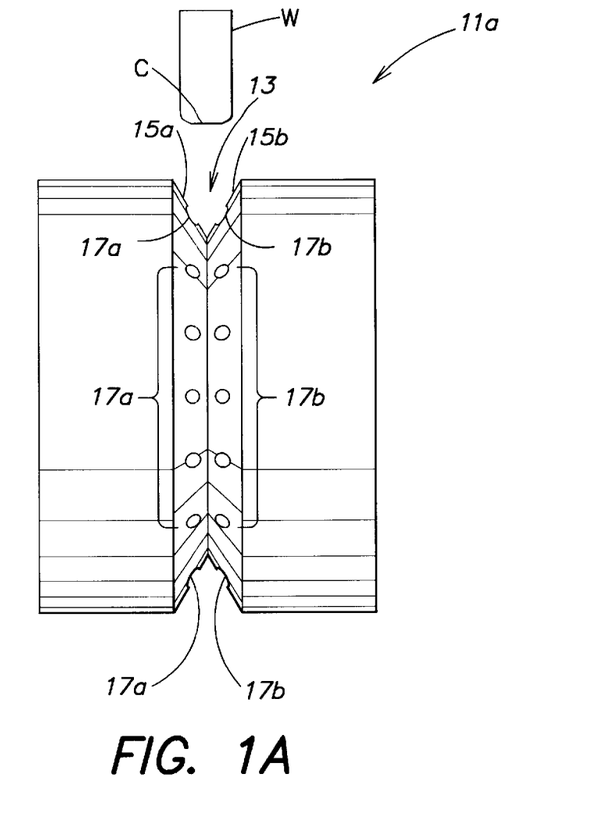
FIG. 1A is a side elevational view of a first embodiment of an inventive roller assembly.

FIG. 1A is a side elevational view of a first embodiment 11a of an inventive roller assembly. The inventive roller assembly 11a comprises a groove 13 having two opposing surfaces 15a, 15b. The inventive roller assembly 11a also comprises a plurality of holes 17a, 17b positioned at spaced intervals along the opposing surfaces 15a, 15b of the groove 13.

Figure 1B:
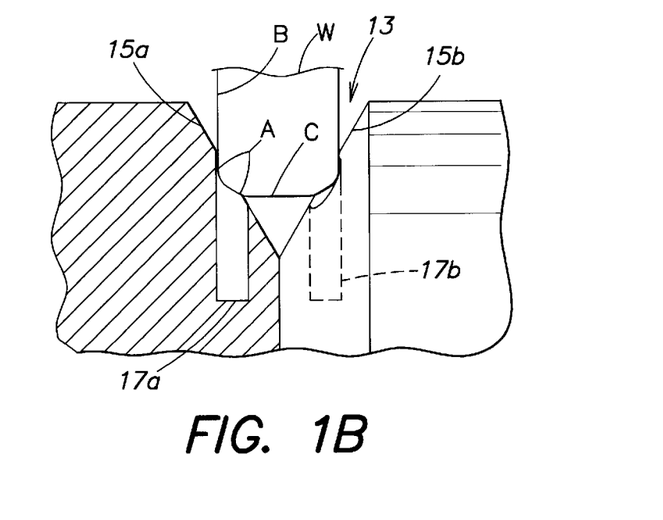
FIG. 1B is a close-up view of the groove of FIG. 1A.

FIG. 1B is a close-up view of the groove 13 of FIG. 1A. A semiconductor wafer W is shown and reference is made to specific portions: a side edge portion A, a side portion B, and an outer edge portion C of the semiconductor wafer W. The groove 13 is configured such that the semiconductor wafer W may contact the groove 13 either entirely along the side edge portion A as shown in FIG. 1B, along a combination of the side edge portion A and the side portion B, or along a combination of the side edge portion A and the bottom edge portion C.

The frictional surfaces along the opposing surfaces 15a, 15b of the groove 13 reduce wafer slippage and reduce the probability that fluid (e.g., fluid used by a cleaning system) will be trapped between the wafer W and the inventive roller assembly 11a. With reference to FIG. 1, trapped fluid may otherwise act as a lubricant and/or cause hydroplaning between a wafer W and a conventional roller assembly. Moreover, the inventive roller assemblies frictional surfaces reduce contact between the wafer W and the opposing surfaces 15a, 15b because the wafer W is contacted by the frictional surfaces rather than by a continuous (e.g., smooth) portion of the opposing surfaces 15a, 15b. Thus, the reduced contact may result in reduced particle generation associated with such contact.

Figure 1C:
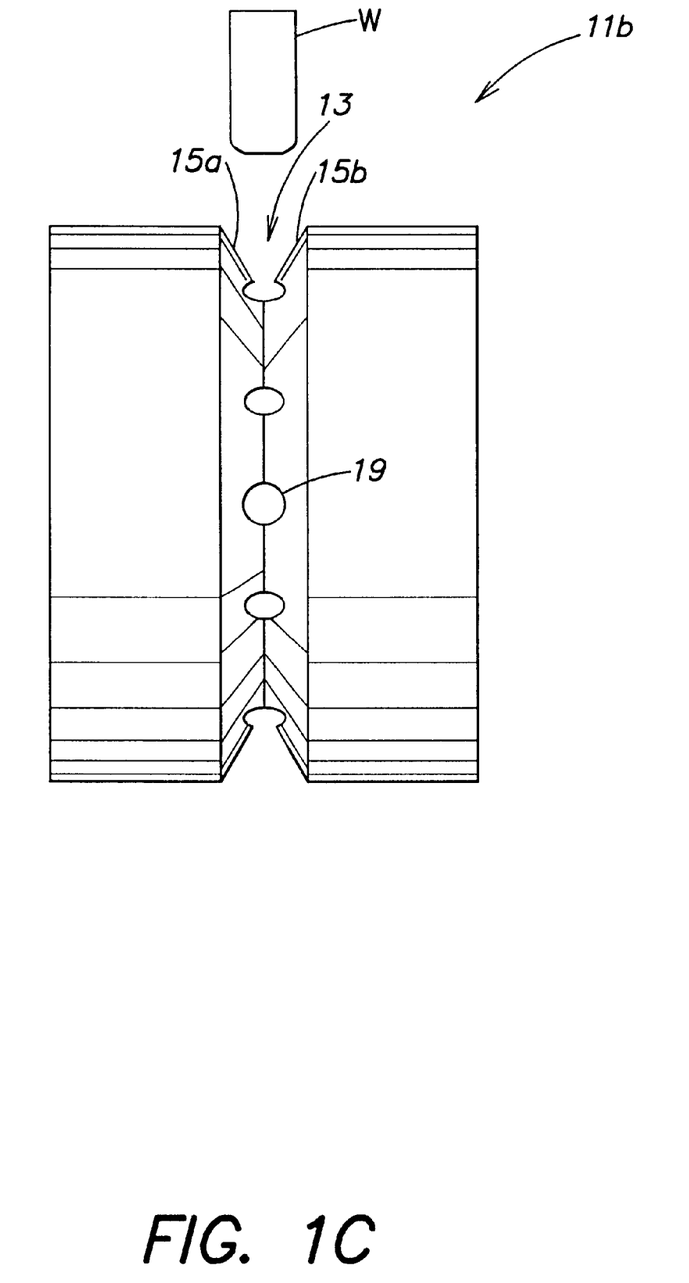
FIG. 1C is a side elevational view of a second embodiment of the inventive roller assembly.

FIG. 1C is a side elevational view of a second embodiment 11b of the inventive roller assembly. The inventive roller assembly 11b comprises a groove 13 having frictional surfaces that comprise a plurality of holes 19, each hole being sized so as to extend into the two opposing surfaces 15a, 15b, at spaced intervals therealong. The plurality of holes 19 are positioned at spaced intervals along the entire circumference of the groove 13. The groove 13 is configured such that the semiconductor wafer W may contact the groove 13 either entirely along the side edge portion A, along a combination of the side edge portion A and the side portion B, or along a combination of the side edge portion A and the bottom edge portion C.

The plurality of holes 17a, 17b in the inventive roller assembly 11a and the plurality of holes 19 in the inventive roller assembly 11b increase the surface area thereof, which may increase the cooling rate of the inventive roller assemblies 11a, 11b as described later with reference to FIG. 6. Note that each hole 17a, 17b and 19 extends approximately perpendicular to an axis of rotation of the rollers.

Figure 2A:
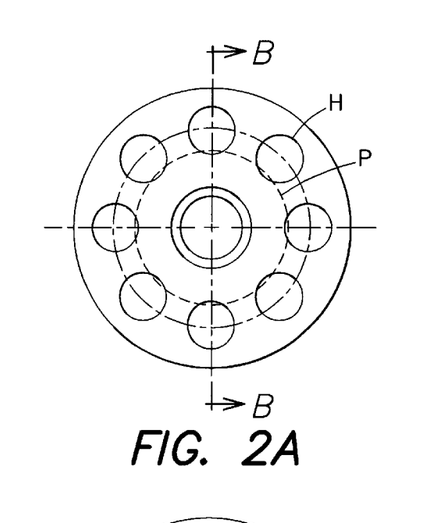
FIG. 2A is a side elevational view of a third embodiment of the inventive roller assembly.
Figure 2B:
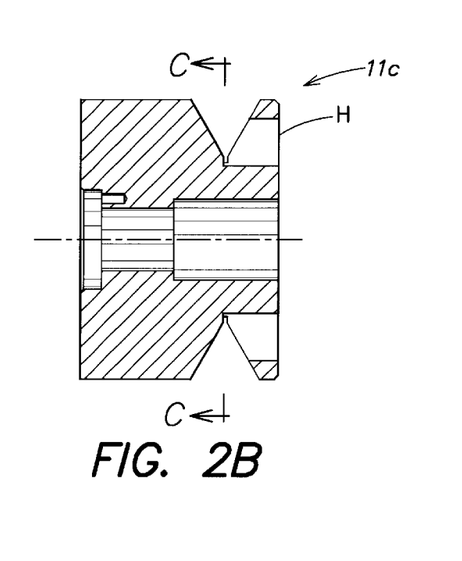
FIG. 2B is a front cross-sectional view of the roller assembly of FIG. 2A taken a long line B—B.
Figure 2C:
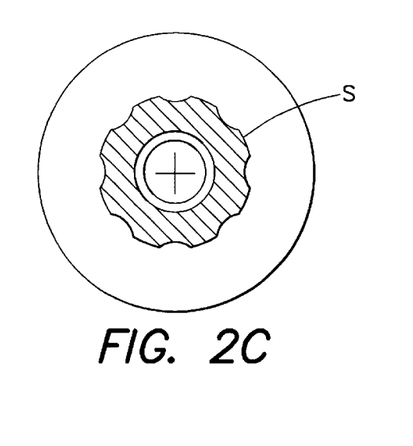
FIG. 2C is a side cross-sectional view of the roller assembly of FIG. 2B, taken along line C—C.
Figure 2D:
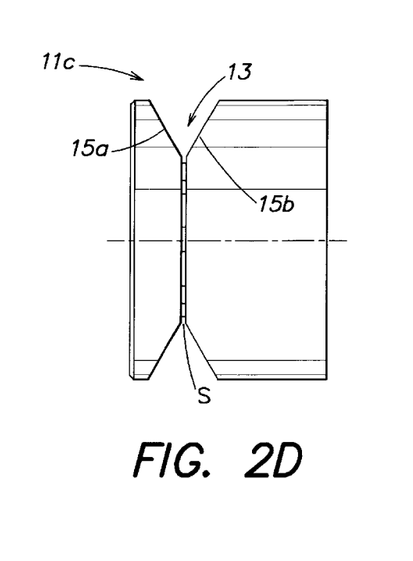
FIG. 2D is a front elevational view of the roller assembly of FIG. 2A.

FIGS. 2A-D show a third embodiment 11c of the invention wherein a plurality of holes H extend perpendicularly through a point P where the two opposing surfaces 15a, 15b, meet (or, stated another way, each hole extends parallel to an axis of rotation of the rollers). FIG. 2A is a side elevational view; FIG. 2B is a front cross-sectional view taken a long line B—B of FIG. 2A; FIG. 2C is a side cross-sectional view, taken along line C—C of FIG. 2B; and FIG. 2D is a front elevational view. As best seen with reference to FIG. 2C, because the holes H extend through the point P where the least two surfaces 15a, 15b meet, the surface S which contacts a wafer's outer edge is scalloped. An exemplary dimension for the diameter of the holes H is 0.22 inches, and an exemplary angle between the surfaces 15a, 15b is 60°.

Figure 3A:
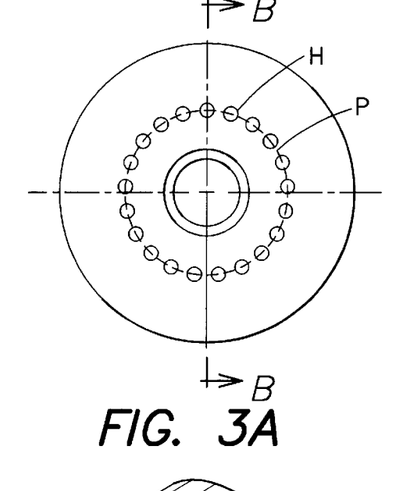
FIG. 3A is a side elevational view of the third embodiment of the inventive roller assembly, having smaller holes than those shown in FIGS. 2A-D.
Figure 3B:
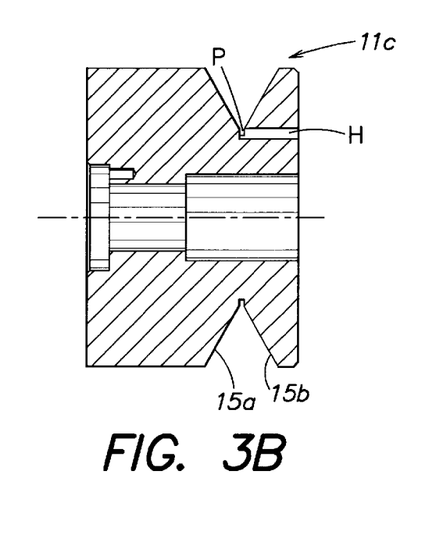
FIG. 3B is a front cross-sectional view of the roller assembly of FIG. 3A taken a long line B—B.
Figure 3C:
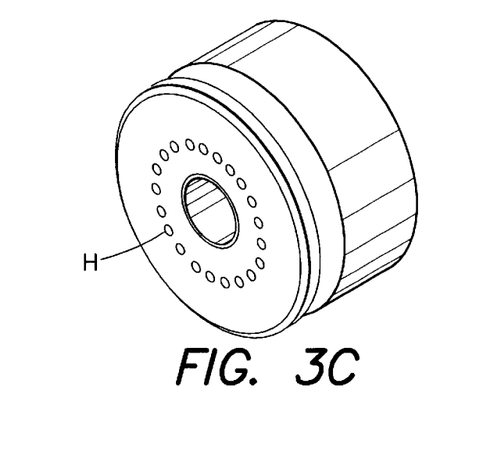
FIG. 3C is a side perspective view of the roller assembly of FIG. 3A.
Figure 3D:
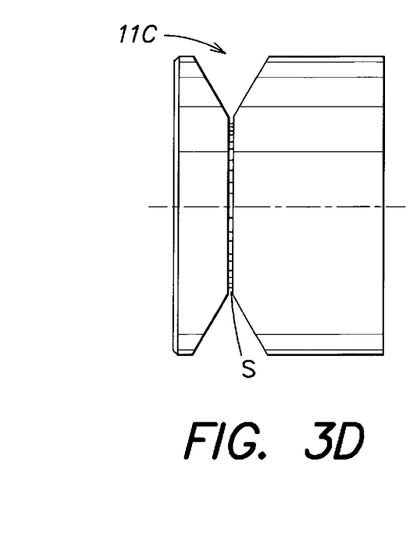
FIG. 3D is a front elevational view of the roller assembly of FIG. 3A.

FIG. 3A is a side elevational view of the third embodiment of the inventive roller assembly, having smaller holes H than those shown in FIGS. 2A-D. FIG. 3B is a front cross-sectional view of the roller assembly of FIG. 3A taken a long line B—B of FIG. 3A; FIG. 3C is a side perspective view of the roller assembly of FIG. 3A; FIG. 3D is a front elevational view of the roller assembly of FIG. 3A. An exemplary dimension for the diameter of the holes H is 0.08 inches, and an exemplary angle between the surfaces 15a, 15b is 60°.

Figure 4:
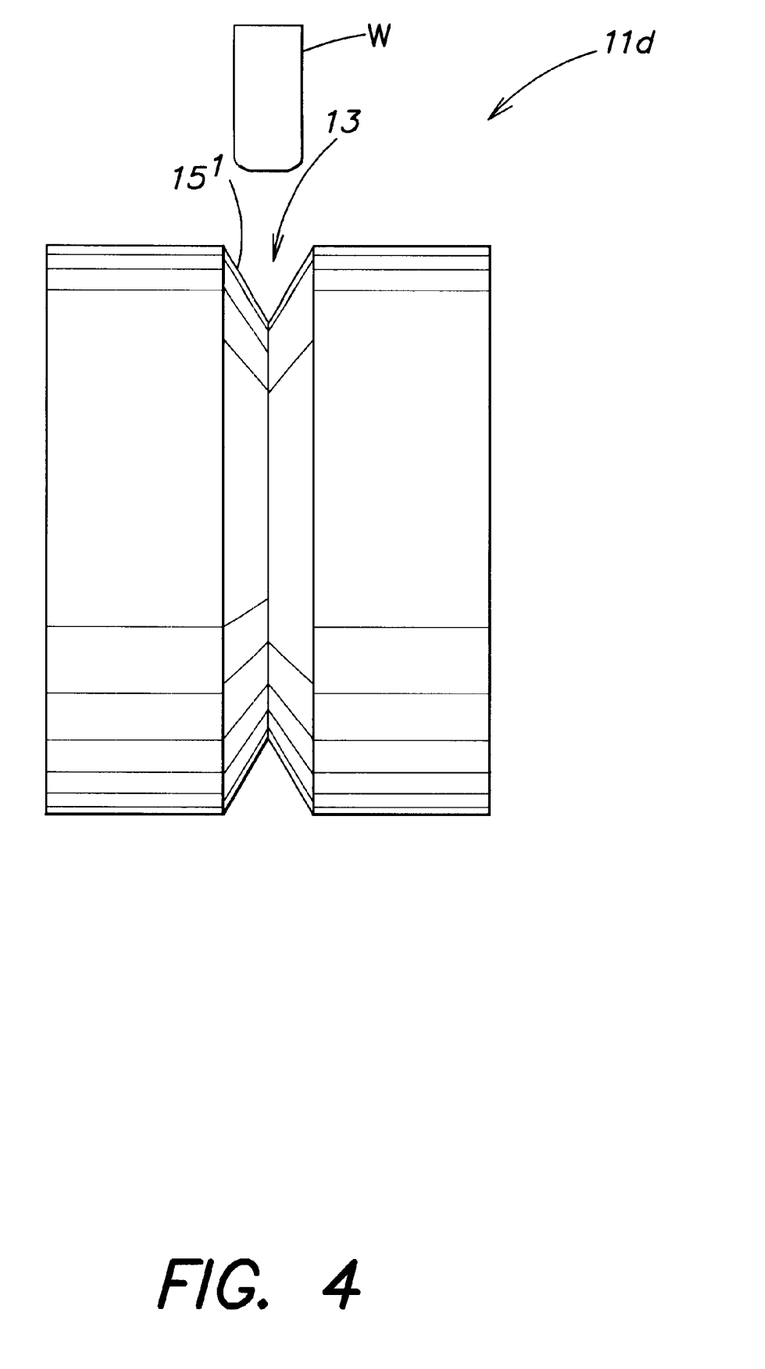
FIG. 4 is a side elevational view of a fourth embodiment of the inventive roller assembly.

FIG. 4 is a side elevational view of a fourth embodiment of the inventive roller assembly 11d. The inventive roller assembly 11d comprises a groove 13 having frictional surfaces that are either bead-blasted or a knurled (hereinafter roughened surfaces $15^1$) positioned along the opposing surfaces 15a, 15b of the groove 13. The roughened surfaces $15^1$ are formed by conventional bead blasting or knurling methods as are conventionally known to workers of ordinary skill in the art. The groove 13 is configured such that the semiconductor wafer W may contact the groove 13 either entirely along the side edge portion A, along a combination of the side edge portion A and the side portion B, or along a combination of the side edge portion A and the bottom edge portion C.

In operation of the inventive roller assemblies 11a–d, a wafer W, which may have the edge portion, the side portion B, and the bottom edge portion C (shown in FIG. 1B), is placed in the groove 13. The edge of the wafer W (e.g., side edge portion A, and outer edge portion B) contacts the groove 13. As the inventive roller assembles 11a–d rotate along their axis of rotation, the frictional surfaces positioned along the opposing surfaces 15a, 15b of the groove 13 contact the wafer W and cause the wafer W to rotate. Via the frictional surfaces, the inventive roller assemblies 11a–d maintain sufficient contact with the wafer W and thus may prevent the wafer W from slipping along the groove 13. Accordingly, the inventive roller assemblies 11a–d may provide smooth-continuous rotation of the wafer W.

Figure 5A:
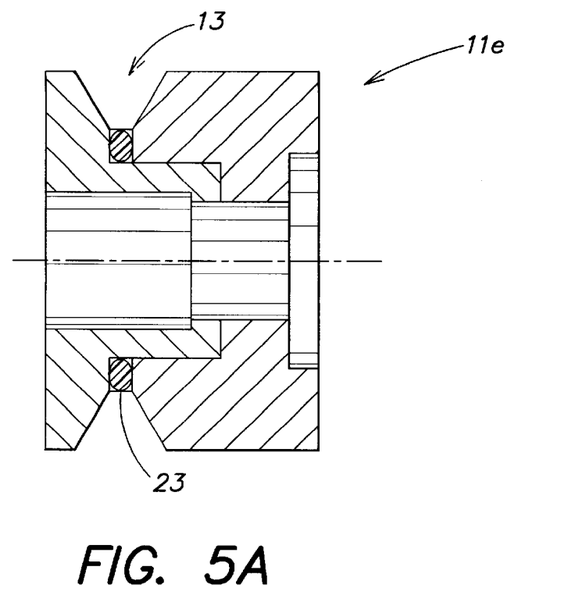
FIG. 5A is a side cross-sectional view of a fifth embodiment of the inventive roller assembly.

FIG. 5A is a side elevational view of a fifth embodiment 11e of the inventive roller assembly. The inventive roller assembly 11e comprises a groove having a first O-ring 23 positioned in the groove 13 and extending circumferentially therearound.

The first O-ring 23 extends around the groove 13 and the groove 13 is sized such that the edge portion C of a semiconductor wafer W may contact the first O-ring. The opposing surfaces 15a, 15b of the groove 13 may be positioned so as to limit wobbling of the wafer W.

The first O-ring 23 may be comprised of a soft and tacky material (e.g., a low durometer rubber that is compatible with any chemistry being applied to the wafer W, etc.) that is sufficiently frictional or sufficiently elastic so as to grip the wafer W. The material is durable so as not to result in particle generation, and so as not to readily deteriorate while exposed to processing conditions (heat, chemistry, etc.), as will be apparent to a worker of ordinary skill in the art of materials. Such materials include Kalrez made by Dupont Dow Elastomers, and Aiges made by International Fuel.

In one aspect, the first O-ring 23 has a width which is larger than the width of the edge portion C of the wafer W. In order to facilitate placement of the O-ring 23 in the groove 13, the roller assembly 11e may comprise two parts, as shown in FIG. 5A.

In operation of the inventive roller assembly 11e, the wafer W, having the side edge portion A, the side portion B, and the bottom edge portion C, is placed in the groove 13 with the first O-ring 23 coupled thereto. As the inventive roller assembly 11e rotates about its axis of rotation, the edge portion C of the wafer W contacts the first O-ring 23, which may comprise a soft and tacky material. Because the soft and tacky material is sufficiently frictional so as to grip the edge portion C of the wafer W, the soft and tacky material of the first O-ring 23 thereby may prevent the edge portion C of the wafer W from slipping therealong. Accordingly, the inventive roller assembly 11e may provide smooth-continuous rotation of the wafer W.

Figure 5B:
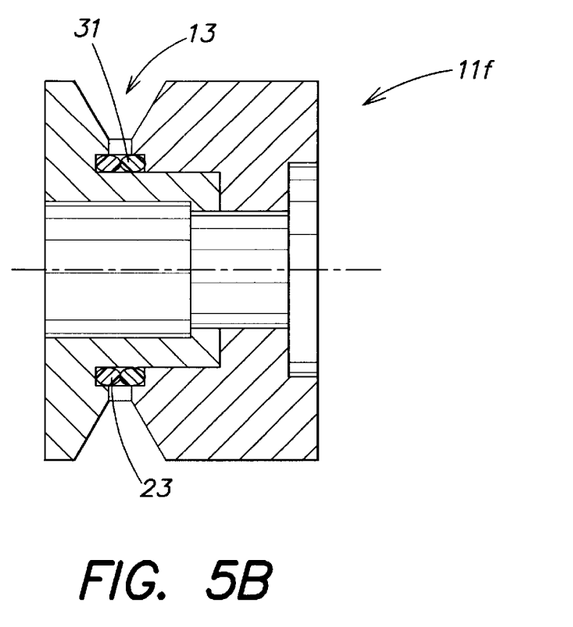
FIG. 5B is a side cross-sectional view of a sixth embodiment of the inventive roller assembly.

FIG. 5B is a side elevational view of a sixth embodiment of the inventive roller assembly 11f. The inventive roller assembly 11f comprises the components of FIG. 5A with the addition of a second O-ring 31 coupled to the groove 13. The second O-ring 31 may be composed of the same material as that of the first O-ring 23. The first O-ring 23 and the second O-ring 31 may extend around the groove 13 and are positioned such that the edge of the semiconductor wafer W may contact both the first O-ring 23 and the second O-ring 31, and in fact, may be inserted therebetween.

In operation of the inventive roller assembly 11f, the wafer W is placed in the groove 13 having the first O-ring 23 and the second O-ring 31 coupled thereto. As the inventive roller assembly 11f rotates along its axis of rotation, at least the edge portion C of the wafer W contacts the first O-ring 23 and the second O-ring 31, which may comprise a soft and tacky material. The inventive roller assembly 11f may maintain sufficient contact with the edge portion C of the wafer W because the O-ring material "grips" the edge portion C of the wafer W. The O-ring material thereby prevents the edge portion C of the wafer W from slipping along the first O-ring 23 and the second O-ring 31. Accordingly, the inventive roller assembly 11f may allow smooth-continuous rotation of the wafer W.

Figure 5C:
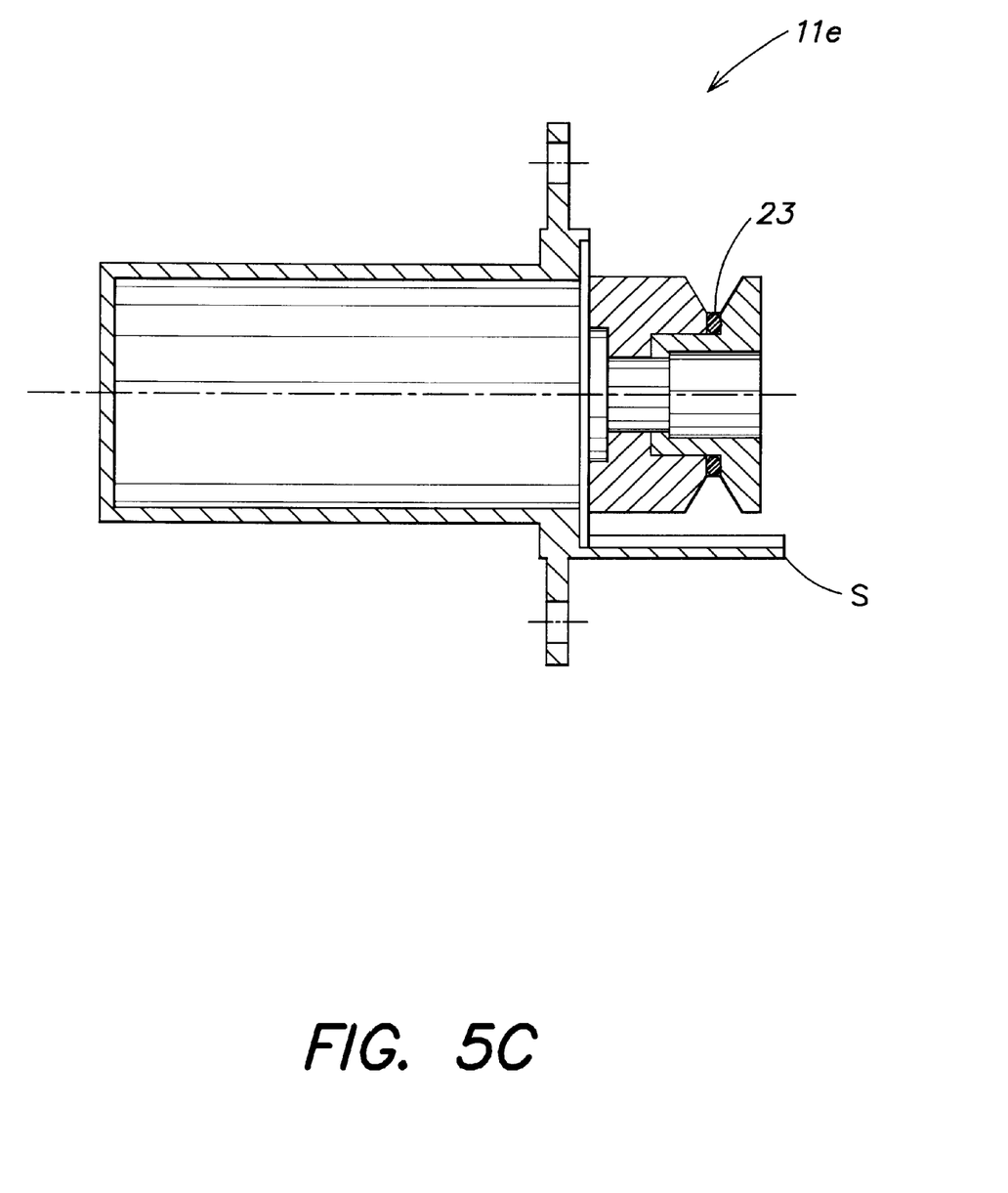
FIG. 5C is a side cross sectional view of the inventive roller assembly of FIG. 5A, including a protective shield.

As shown in FIG. 5C, in order to protect the O-rings 23, 31 from damage that may be caused by contact with the energy output by a transducer (see FIG. 6), a shield S may be positioned so as to shield the inventive roller assembly (or so as to shield at least the O-rings) from the transducer's energy. The shield S may be mounted to a stationary housing portion of the roller assembly as shown.

Figure 6:
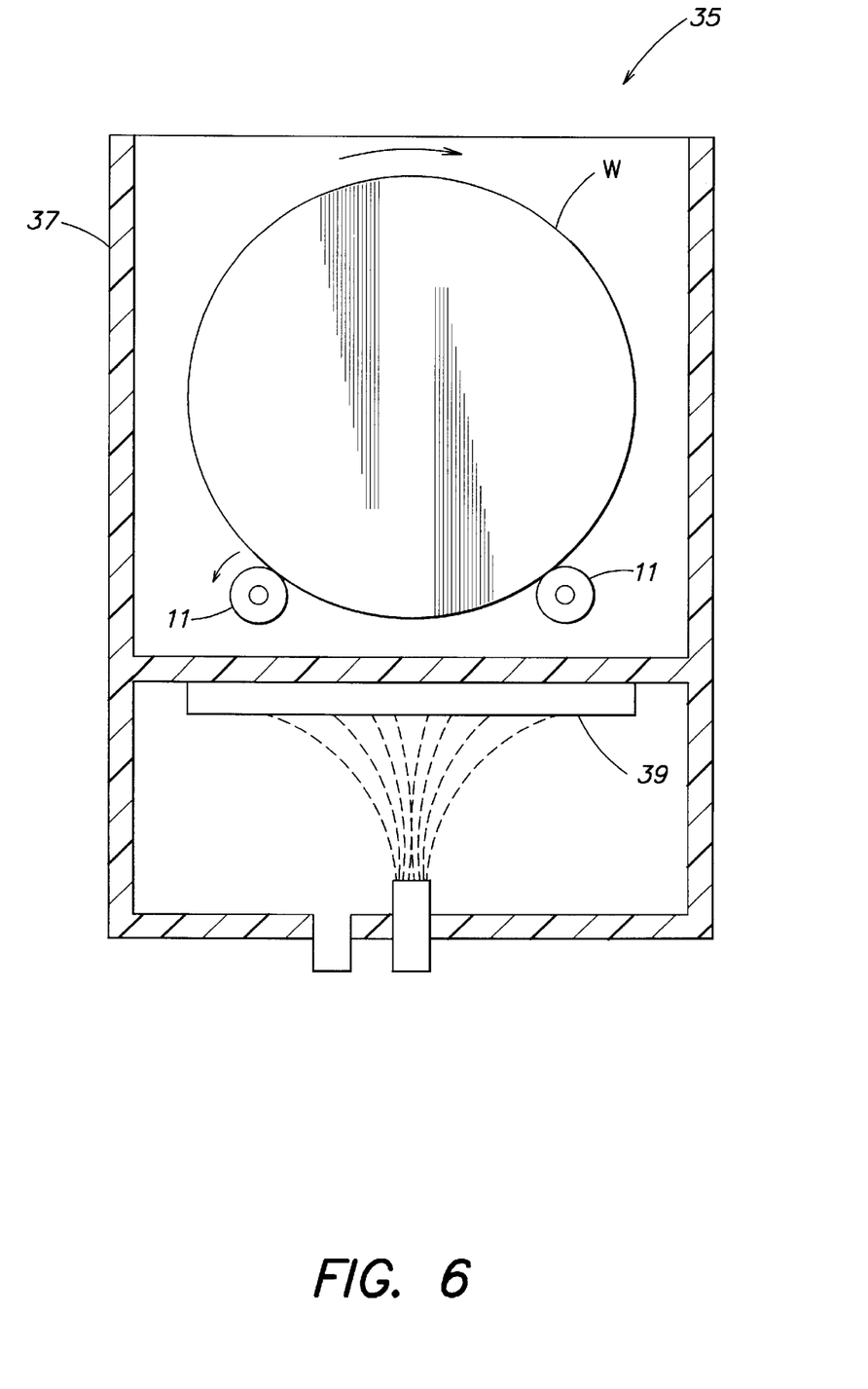
FIG. 6 is a front elevational view of a megasonic tank that employs any embodiment of the inventive roller assembly.

FIG. 6 is a front elevational view of a megasonic tank 35 that employs any embodiment of the inventive roller assembly 11. The megasonic tank 35 comprises a tank 37 (e.g., a plastic tank) adapted to contain a cleaning fluid such as deionized water. The megasonic tank 35 also comprises a transducer 39 positioned along the bottom thereof, adapted to oscillate at a megasonic rate causing bubbles to form in the cleaning fluid. The transducer 39 may be equal in length to the diameter of the wafer W to be cleaned thereby. Above the transducer 39, a first inventive roller assembly 11 and a second inventive roller assembly 11 are positioned to vertically support the wafer W in line with the transducer 39. The megasonic tank 35 is preferably configured as described in U.S. patent application Ser. No. 09/191,057, filed Nov. 11, 1998, the entire disclosure of which is incorporated herein by this reference.

In operation, the megasonic tank 35 is filled with cleaning fluid. The wafer W is placed in the megasonic tank 35, and is supported by the inventive roller assemblies 11. The transducer 39 oscillates at a megasonic rate causing bubbles to form in the cleaning fluid. The bubbles clean the surface of the wafer W, as is known in the art (i.e., the transducer 39 outputs cleaning energy). The cleaning energy output by the transducer 39 travels across the surface of the wafer W, cleaning the surface of the wafer W. During cleaning, the inventive rollers 11 are energized and rotate causing the wafer W supported thereby to rotate. Thus, the entire surface of the wafer W is cleaned.

The megasonic tank 35 typically operates at a high temperature because the transducer 39 may generate heat while oscillating and in turn, may heat the cleaning fluid and the inventive roller assemblies 11. As stated previously, the plurality of holes 17a, 17b in the inventive roller assembly 11a and the plurality of holes 19 in the inventive roller assembly 11b increase the surface area thereof. Hence, the increased surface area may result in an increased cooling rate of the inventive roller assemblies 11a, 11b. Accordingly, the increased cooling rate may prevent the inventive roller assemblies 11a, 11b from overheating and thereby being damaged, or damaging the substrate.

The dimensions given for the inventive roller 11 are meant to illustrate the preferred embodiment, and not to limit the scope of the present invention. It should be understood that any of these dimensions may vary depending on the diameter and thickness of a wafer and the dimensions may be adjusted to serve the purpose of the present invention.

The foregoing description discloses only the preferred embodiments of the invention, modifications of the above-disclosed apparatus and method which fall within the scope of the invention will be readily apparent to those of ordinary skill in the art. For instance, although the invention has been described in a vertical orientation, it may be used in any orientation (e.g., horizontal, etc.), and may be used within fluid filled tanks other than the exemplary tank described herein. In fact, the inventive roller 11 may be used advantageously within any system that requires substrate rotation or that would benefit from increased friction between the roller and the substrate, such as scrubbers and the like. An exemplary scrubber is disclosed in U.S. patent application Ser. No. 09/580,879, filed May 30, 2000, the entire disclosure of which is incorporated herein by this reference. Further, the invention applies generally to the rotation of any disk shaped substrate (patterned or unpatterned wafers, glass substrates, LCD's and the like) regardless of the specific process employed.

The inventive roller assemblies that comprise the O-ring (s) 23, 31 may also comprise the plurality of holes 17a, 17b positioned along each opposing surface, or the plurality of holes 19 extending between the two opposing surfaces which increase the surface area thereof. Hence, the increased surface area also may provide an increased cooling rate for the inventive roller assembly 11f. In the two O-ring embodiment the O-rings may themselves be beveled along their edges so as to minimize wafer contact.

Similarly, in a single O-ring embodiment a groove may be machined or formed along the central region of the O-ring, to minimize wafer contact.

Thus, while the present invention has been disclosed in connection with the preferred embodiments thereof, it should be understood that other embodiments may fall within the spirit and scope of the invention, as defined by the following claims.

The invention claimed is:

1. A roller adapted to rotate a thin disk, the roller comprising:
   a groove having at least two surfaces adapted to contact an edge of the thin disk; and
   a plurality of holes located along at least one of the two surfaces, each hole extending parallel to an axis of rotation of the roller.

2. The roller of claim 1, wherein each of the holes extends through a point where the at least two surfaces meet, thereby forming a scalloped surface adapted to contact a wafer's outer edge.

3. The roller of claim 1, wherein each of the holes extends parallel to a point where the at least two surfaces meet, and wherein each of the holes is sized so as to extend into each of the two surfaces.

4. The roller of claim 1 wherein each of the holes extend parallel to a point where the at least two surfaces meet.

5. The roller of claim 4, wherein each of the holes is sized so as to extend into each of the two surfaces.

6. A roller adapted to rotate a thin disk, the roller comprising:
   a groove having at least two surfaces adapted to contact an edge of the thin disk; and
   a plurality of holes formed in at least one of the two surfaces, the holes being adapted to reduce a probability of trapping fluid between the thin disk and the roller;
   wherein each of the holes extends through a point where the at least two surfaces meet, thereby forming a scalloped surface adapted to contact a wafers's outer edge.

7. The roller of claim 6 wherein each of the holes extends perpendicular to a point where the at least two surfaces meet.

8. The roller of claim 6, wherein each of the holes extend parallel to a point where the at least two surfaces meet, and wherein each of the holes is sized so as to extend into each of the two surfaces.

9. A roller adapted to rotate a thin disk, the roller comprising:
   a groove having at least two surfaces adapted to contact an edge of the thin disk; and
   a plurality of holes formed in at least one of the two surfaces, the holes being adapted to reduce a probability of trapping fluid between the thin disk and the roller;
   wherein each of the holes extends perpendicular to a point where the at least two surfaces meet.

10. A roller adapted to rotate a thin disk, the roller comprising:
    a groove having at least two surfaces adapted to contact an edge of the thin disk; and
    a plurality of holes formed in at least one of the two surfaces, the holes being adapted to reduce slippage of the thin disk relative to the roller;
    wherein each of the holes extends through a point where the at least two surfaces meet, thereby forming a scalloped surface adapted to contact a wafer's outer edge.

11. The roller of claim 10 wherein each of the holes extends perpendicular to a point where the at least two surfaces meet.

12. The roller of claim 10, wherein each of the holes extend parallel to a point where the at least two surfaces meet, and wherein each of the holes is sized so as to extend into each of the two surfaces.

13. A roller adapted to rotate a thin disk, the roller comprising:
    a groove having at least two surfaces adapted to contact an edge of the thin disk; and
    a plurality of holes formed in at least one of the two surfaces, the holes being adapted to reduce slippage of the thin disk relative to the roller;
    wherein each of the holes extends perpendicular to a point where the at least two surfaces meet.

* * * * *